United States Patent
Medelius et al.

(10) Patent No.: US 6,452,373 B2
(45) Date of Patent: Sep. 17, 2002

(54) TRANSIENT VOLTAGE RECORDER

(75) Inventors: Pedro J. Medelius, Merritt Island, FL (US); Howard J. Simpson, Eustis, FL (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 12 days.

(21) Appl. No.: 09/758,051

(22) Filed: Jan. 8, 2001

Related U.S. Application Data

(60) Provisional application No. 60/175,168, filed on Jan. 7, 2000.

(51) Int. Cl.$^7$ ................................................ G01R 31/02
(52) U.S. Cl. ........................................ 324/72; 324/102
(58) Field of Search ......................... 340/659; 361/33; 324/102, 113, 72, 112, 133

(56) References Cited

U.S. PATENT DOCUMENTS

| | | |
|---|---|---|
| 3,573,614 A | 4/1971 | Wittbrodt |
| 3,662,380 A | 5/1972 | Cargile |
| 3,889,185 A | 6/1975 | Wojtasinski et al. |
| 4,105,966 A | 8/1978 | Lennon et al. |
| 4,112,357 A | 9/1978 | Livermore |
| 4,311,960 A | 1/1982 | Barr |
| 4,362,986 A * | 12/1982 | Burke ........................ 324/113 |
| 4,672,305 A * | 6/1987 | Coleman ..................... 324/72 |
| 4,728,885 A | 3/1988 | DeSanto |
| 4,879,623 A | 11/1989 | Baumgartner et al. |
| 5,044,767 A | 9/1991 | Gustafsson |
| 5,717,325 A | 2/1998 | Leeb et al. |
| 5,845,231 A | 12/1998 | Moore et al. |
| 5,929,625 A | 7/1999 | Lewiner et al. |
| 5,973,604 A | 10/1999 | Eslambolchi et al. |

FOREIGN PATENT DOCUMENTS

| | | | |
|---|---|---|---|
| JP | 406244723 | * | 9/1994 |
| WO | WO 9705697 | * | 2/1997 |

OTHER PUBLICATIONS

Pedro Medelius, C. M. Ihlefeld, H. J. Simpson, J.D. Taylor, and J. J. Henderson, "Transient Voltage Recorder for Power and Data Line Monitoring" Electronic and Instrumentation Published Sep. 1998.

* cited by examiner

*Primary Examiner*—Christine K. Oda
(74) *Attorney, Agent, or Firm*—Gary G. Borda; John G. Mannix

(57) ABSTRACT

A voltage transient recorder can detect lightning induced transient voltages. The recorder detects a lightning induced transient voltage and adjusts input amplifiers to accurately record transient voltage magnitudes. The recorder stores voltage data from numerous monitored channels, or devices. The data is time stamped and can be output in real time, or stored for later retrieval. The transient recorder, in one embodiment, includes an analog-to-digital converter and a voltage threshold detector. When an input voltage exceeds a pre-determined voltage threshold, the recorder stores the incoming voltage magnitude and time of arrival. The recorder also determines if its input amplifier circuits clip the incoming signal or if the incoming signal is too low. If the input data is clipped or too low, the recorder adjusts the gain of the amplifier circuits to accurately acquire subsequent components of the lightning induced transients.

22 Claims, 2 Drawing Sheets

TRANSIENT VOLTAGE RECORDER

This patent application is based on provisionally filed patent application Serial No. 60/175,168 entitled "High Speed Transient Voltage Recording System" by Pedro J. Medelius et al. filed Jan. 7, 2000. The invention described herein was made in the performance of work under a NASA contract and is subject to the provisions of Section 305 of the National Aeronautics and Space Act of 1958, as amended, Public Law 85-568 (72 Stat. 435; 42 U.S.C. §2457).

BACKGROUND OF THE INVENTION

The present invention relates generally to voltage recorders and in particular the present invention relates to transient voltage recorders. Voltage transients caused by atmospheric disturbances are often present in power and communication lines. These transients are especially noticeable following a nearby lightning strike. Although most electronic equipment has some form of transient protection, some limitations exist on maximum sustainable transient levels. This limitation is determined by both the amplitude and duration that the equipment can withstand before permanent damage occurs. Electronic components and equipment can have an immediate, easy to detect failure when they are subjected to voltages larger than their maximum rated values. Obvious failures include short-circuited components, open components, or non-functional components. Transient voltages can also alter characteristics of an electronic component without obvious sign of failure. Unless there is a way to determine that transient voltages were present, such anomalies can remain undetected and eventually lead to premature failure of a component.

Transient voltage recorders have been used for many years to monitor voltages and currents on cables. Common sources of transient voltages include large electronic motors, switching of power equipment, induced voltages from nearby lightning strikes, and direct lightning strikes. Transients generated by sources other that lightning tend to have frequency components well below one megahertz, which most commercial transient recorders can detect. On the other hand, recent research has shown that lightning induced transients contain voltage peaks that rise in a small fraction of a microsecond and contain frequencies exceeding tens of megahertz. Commercially available recorders cannot measure these fast peaks. Thus, incorrect indications of the magnitude of the peak value of transients are provided.

For the reasons stated above, and for other reasons stated below which will become apparent to those skilled in the art upon reading and understanding the present specification, there is a need in the art for a transient voltage recorder that can accurately characterize lightning induced voltage transients.

SUMMARY OF THE INVENTION

The above-mentioned problems with voltage transient recorders and other problems are addressed by the present invention and will be understood by reading and studying the following specification.

In one embodiment, a transient voltage recorder comprises an input to receive a voltage signal, an amplifier coupled to the input, an amplifier gain adjust circuit coupled to adjust a gain of the amplifier, and a sample and hold circuit coupled to the amplifier.

In another embodiment, a transient voltage recorder comprises an input to receive a voltage signal, an amplifier coupled to the input, an amplifier gain adjust circuit coupled to adjust a gain of the amplifier and an analog-to-digital converter coupled to the amplifier. The transient voltage recorder includes a voltage threshold circuit, and a controller coupled to the analog-to-digital converter, the voltage threshold circuit and the amplifier gain adjust circuit. The controller monitors an output of the amplifier in response to the voltage threshold circuit and determines if the output from the amplifier is clipped or is too low. The controller further controls the amplifier gain adjust circuit to adjust the gain of the amplifier.

In yet another embodiment, a transient voltage recorder comprises a plurality of input amplifiers each coupled to receive one of a plurality of input voltage signals, and an amplifier gain adjust circuit coupled to adjust a gain of the plurality of amplifiers. An analog-to-digital converter is coupled to outputs of the plurality of amplifiers. Further, a voltage threshold circuit is coupled to the outputs of the plurality of amplifiers. The voltage transient recorder further comprises a non-volatile memory device, a time circuit, and a controller coupled to the analog-to-digital converter, the voltage threshold circuit, the non-volatile memory device and the amplifier gain adjust circuit. The controller monitors the outputs of the plurality of amplifiers in response to the voltage threshold circuit and determines if the outputs of the plurality of amplifiers are magnitude clipped or have a low signal. The controller further controls the amplifier gain adjust circuit to adjust the gain of the amplifier.

A method of recording a transient voltage is provided that comprises monitoring an input voltage signal, detecting when the input voltage signal exceeds a pre-determined threshold voltage level, determining if an input amplifier gain it too large or too small for the input voltage signal, and reducing or increasing the gain of the input amplifier to capture the input voltage signal.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
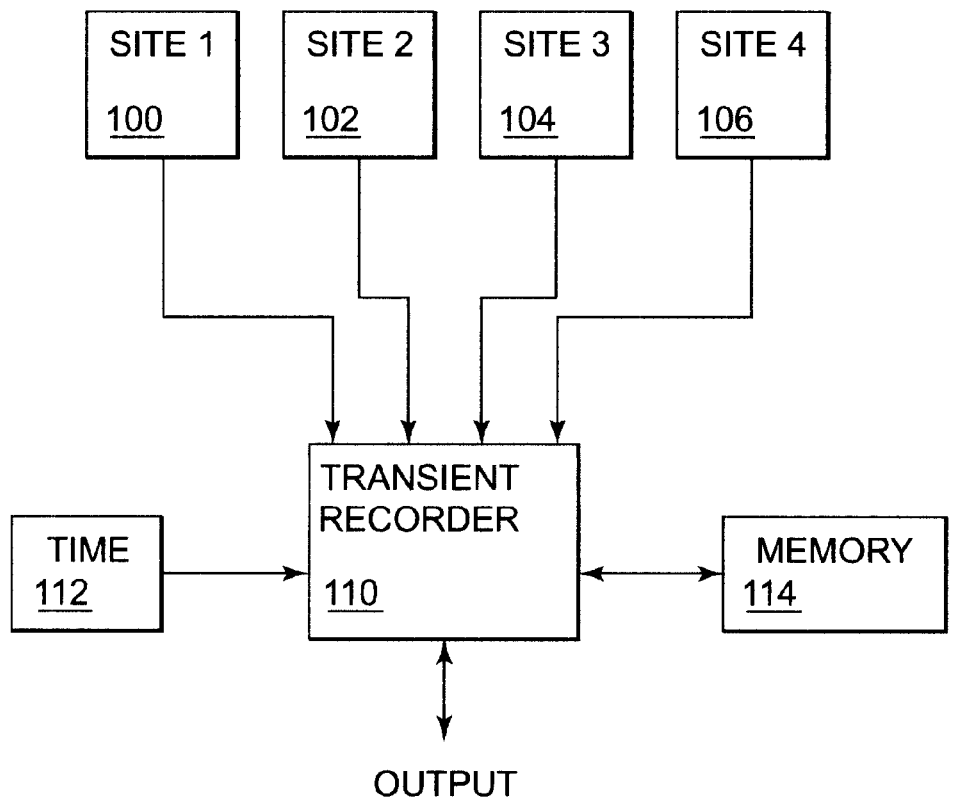
FIG. 1 is a block diagram of a transient voltage detector system of an embodiment of the present invention.

Referring to FIG. 1, a block diagram of a transient voltage monitoring system of one embodiment of the present invention is illustrated. This embodiment of the system includes a number of electronic sites to be monitored, however any number of sites may be used, including one site. The sites can be remotely located, closely located to each other, or collocated. In the illustrated system, four sites 100, 102, 104 and 106 are monitored for transient voltages. These sites can be any type of electronic circuit, or device, that are susceptible to voltage transients. The term site is used herein to generally refer to electronic equipment, electronic signal lines, interconnects, voltage nodes and the like. A transient voltage recorder 110 is coupled to the sites and is capable of detecting lightning induced as well as any other types of voltage transients. The detected transient magnitude and time of detection are stored in a memory 114. The time is accurately determined through an external time device 112. Alternately, the time can be provided through an internal circuit. Output from the transient recorder can be remotely monitored to determine if transients have been recorded.

Figure 2:
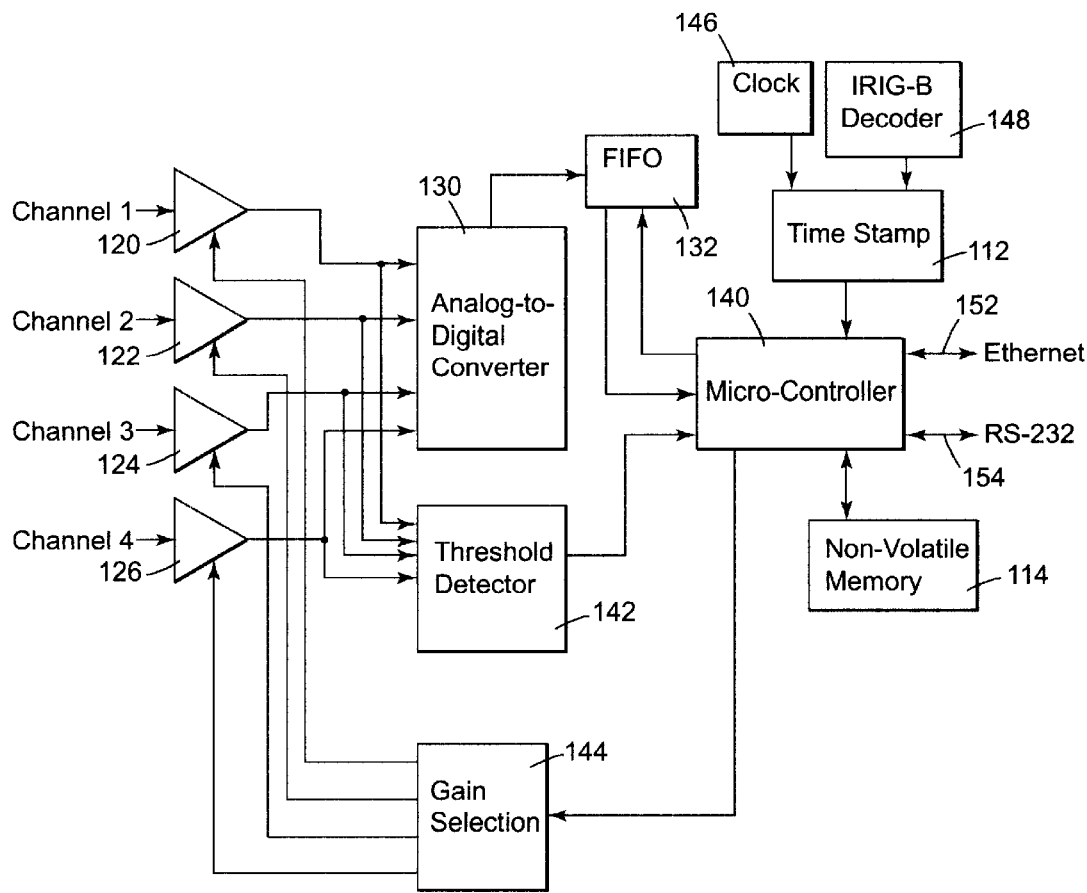
FIG. 2 is a more detailed diagram of a voltage transient detector system of an embodiment of the present invention.

A more detailed illustration of one embodiment of a transient voltage recorder of the present invention is provided in FIG. 2. The recorder includes several channel inputs coupled to amplifier circuits 120, 122, 124 and 126. The outputs of the amplifiers are coupled to sample and hold circuitry. In one embodiment, the sample and hold circuitry includes an analog-to-digital converter 130 to provide digital transient magnitude data. The analog-to-digital converter can be a 12-bit analog-to-digital converter or any other equivalent device. The digital output is routed through FIFO buffer 132 to a micro-controller 140. The buffer can store data from each channel that is monitored. As explained below, buffer block 132 can include multiple buffer circuits of different bandwidth and depth. The sample time of the FIFO is controlled by the micro-controller and can be externally adjusted. The micro-controller can also store the digital output in memory 114, which for example may be non-volatile memory. The micro-controller is capable of storing a time-stamp (time of arrival) with the digital data. A time-stamp circuit 112 may use output signals from a clock 146 and/or an Inter-Range Instrumentation Group (IRIG-B) decoder 148. The IRIG decoder decodes time from a satellite system. Accurate time stamping becomes especially important if there is a need to correlate a transient voltage with another measurement, such as those obtained with a lightning location system.

The micro-controller can provide output magnitude and time data in real time or from the memory data. The output can be monitored via an Ethernet connection 152, an RS232 connection 154, or other communication mode, such as a two-way radio or cellular data link. The non-volatile memory can be, but is not limited to, a memory device, such as a FLASH memory, a hard disk drive, or a CD-rom. The transient recorder includes a gain select circuit 144 coupled to the micro-controller. The gain select circuit is also coupled to the input amplifiers to selectively adjust the gain of the amplifiers.

In operation, the transient voltage recorder may be used to monitor power and communication lines susceptible to induced and/or direct effects from lightning, however the transient voltage recorder is not limited to measuring the transient voltage effects of lightning nor is it limited to power or communication lines. A typical lightning strike consists of a first voltage transient followed by one or more subsequent voltage transients of similar intensity. The present recorder detects the first transient and adjusts itself to capture the subsequent transient voltages.

During operation, the threshold detector is triggered when any of the incoming voltage signals exceeds a threshold voltage. The transient recorder acquires data from all of the input channels, preferably simultaneously. A trigger signal from any channel will cause all of the channels to digitize. The transient recorder continuously digitizes incoming waveforms at a rate of mega samples per second (MS/s), with a sampling rate going as high as desired, for example 200 MS/s. The incoming digitized signals are then captured by buffer 132. The threshold value and polarity for each channel can be independently set. The threshold levels can be set from 1% to 99% of full scale, in one embodiment. Example input voltage ranges can be +/−10V, 50V and 100V. Further, the input termination can be selected, for example among 10, 50, 120 ohms. The threshold detector can be reset within a few hundred milliseconds. The recorder can be rearmed within a few microseconds.

In one embodiment, FIFO buffer 132 includes two sets of buffers (illustrated in FIG. 2 as a common block). The first set of buffers is deep enough to store a complete waveform. In one embodiment, the buffer stores 4 k bytes for a 200 $\mu s$ record, sampled at 20 MS/s. The buffer is maintained at a level of about one-half of its capacity during normal monitoring. When the threshold circuit is triggered, the first set of buffers is allowed to fill-up to capacity. When the first buffers are full, data is transferred to the second set of buffers. As such, the recorder captures information prior to the trigger operation. The depth of the first and second set of buffers can be selected to maintain enough storage as needed.

The transient voltage recorder detects when a transient voltage is large enough to saturate the input amplifiers (which results in signal clipping) or is too small to be recorded. That is, the threshold detector monitors the output of the amplifiers and determines if a transient voltage is present (exceeds a pre-set threshold voltage). As explained, the threshold detector monitor signals the micro-controller when a transient voltage is present. The digital output of the analog-to-digital converter 130 is processed by the micro-controller to determine if signal clipping is present or if a signal is too small for detections. A clipped signal will provide several voltage samples having the same digital value. A too small signal can be detected when signals from other channels at the same threshold are recorded and the too small signal is not recorded.

In response to detecting signal clipping, the micro-controller instructs the gain controller to adjust the sensitivity (gain) of the amplifier(s). That is, the gain of the amplifier(s) is reduced. In response to a too low signal, the micro-controller instructs the gain controller to increase the gain of the amplifier(s). After the amplifiers have been adjusted, the subsequent lightning induced voltage transients are detected and stored in memory. The subsequent voltage transients are correctly acquired (without amplifier saturation). Following the end of the lightning event (about one second of inactivity), the micro controller restores the amplifier gain to a default value.

Using the FIFO buffer, the transient voltage recorder allows for recording of activity preceding the onset of the transient (such as 100 microseconds) and activity following the onset (also 100 microseconds by default). An operator can remotely select a data-sampling rate, for example, from a 20 mega-samples per second default rate, and increase a recording time. The relative duration of the preceding time and the post-trigger time can also be remotely selected while maintaining just a few microseconds of dead time between subsequent recordings.

In one embodiment, the recorder can independently adjust the gain of each amplifier based upon its output. In addition, the recorder can store voltage data from each channel when triggered by any of the channels. That is, a trigger from any of the monitored channels automatically initiates data acquisition from all monitored channels.

A voltage transient recorder has been described that can detect rapidly induced transient voltages. The recorder detects a transient voltage and adjusts input amplifiers to accurately record transient voltage magnitudes. The recorder stores voltage data from numerous monitored channels, or devices. The data is time stamped and can be output in real time, or stored for later retrieval. The transient recorder, in one embodiment, includes an analog-to-digital converter and a voltage threshold detector. When an input voltage exceeds a predetermined voltage threshold, the recorder stores the incoming voltage magnitude and time of arrival. The recorder also determines if its input amplifier circuits clip the incoming signal or if the signal is too low. If the input data is clipped or if the signal is too low, the recorder adjusts the gain of the amplifier circuits to accurately acquire subsequent components of the voltage transients.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A voltage transient recorder comprising:
   an input to receive a voltage signal;
   an amplifier coupled to the input;
   an amplifier gain adjust circuit coupled to adjust a gain of the amplifier; and
   a sample and hold circuit coupled to the amplifier to capture a transient voltage received on the input.

2. The transient voltage recorder of claim 1 wherein the sample and hold circuit comprises:
   an analog-to-digital converter coupled to the amplifier; and
   a controller coupled to the analog-to-digital converter and the amplifier gain adjust circuit, wherein the controller determines if an output from the amplifier is clipped or too low and controls the amplifier gain adjust circuit to adjust the gain of the amplifier.

3. The transient voltage recorder of claim 2 further comprises:
   a non-volatile memory device; and
   a time circuit, wherein the controller stores output from the analog-to-digital converter and a corresponding time of arrival, determined by the time circuit, in the non-volatile memory device.

4. The transient voltage recorder of claim 1 wherein the sample and hold circuit comprises:
   an analog-to-digital converter coupled to the amplifier;
   a voltage threshold circuit; and
   a controller coupled to the analog-to-digital converter, the voltage threshold circuit and the amplifier gain adjust circuit, wherein the controller monitors an output of the amplifier in response to the voltage threshold circuit and determines if the output from the amplifier is clipped or too low, the controller further controls the amplifier gain adjust circuit to adjust the gain of the amplifier.

5. The transient voltage recorder of claim 4 further comprises:
   a memory device; and
   a time circuit, wherein the controller stores output from the analog-to-digital converter and a corresponding time of arrival, determined by the time circuit, in the memory device.

6. The transient recorder of claim 4 wherein the recorder is rearmed within a few microseconds of receiving the voltage signal.

7. The transient voltage recorder of claim 4 wherein the voltage signal is sampled at least 20 mega-samples per second.

8. The transient voltage recorder as claimed in claim 4, wherein the transient voltage recorded is induced by lightning.

9. A voltage transient recorder comprising:
   an input to receive a voltage signal;
   an amplifier coupled to the input;
   an amplifier gain adjust circuit coupled to adjust a gain of the amplifier;
   a sample and hold circuit coupled to the amplifier, the sample and hold circuit comprises,
      an analog-to-digital converter coupled to the amplifier,
      a voltage threshold circuit, and
      a controller coupled to the analog-to-digital converter, the voltage threshold circuit and the amplifier gain adjust circuit, wherein the controller monitors an output of the amplifier in response to the voltage threshold circuit and determines if the output from the amplifier is clipped or too low, the controller further controls the amplifier gain adjust circuit to adjust the gain of the amplifier;
   a memory device;
   a time circuit, wherein the controller stores output from the analog-to-digital converter and a corresponding time of arrival, determined by the time circuit, in the memory device;
   a plurality of input amplifiers each coupled to receive one of a plurality of input voltage signals;
   the amplifier gain adjust circuit is coupled to adjust a gain of the plurality of amplifiers;
   the analog-to-digital converter is coupled to outputs of the plurality of amplifiers;
   the voltage threshold circuit is coupled to the outputs of the plurality of amplifiers; and
   the controller monitors the outputs of the plurality of amplifiers in response to the voltage threshold circuit and determines if the outputs of the plurality of amplifiers are magnitude clipped or too low.

10. A method of recording a transient voltage comprising:
    monitoring an input voltage signal;
    detecting when the input voltage signal exceeds a pre-determined threshold voltage level;
    determining if an input amplifier gain is too large or too small for the input voltage signal; and
    reducing or increasing the gain of the input amplifier to capture the input voltage signal.

11. The method of claim 10 wherein monitoring the input voltage comprises:
    converting the input voltage signal to digital data; and
    comparing the input voltage signal to the pre-determined threshold voltage level.

12. The method of claim 11 wherein determining if the input amplifier gain it too large comprises:
    comparing successive output samples of the digital data; and
    determining that an output of the input amplifier is clipped if the successive output samples of the digital data are substantially the same.

13. The method of claim 10 further comprises storing the input voltage signal and a corresponding time of arrival.

14. The method of claim 10 wherein the recorder is rearmed within a few microseconds of receiving a voltage signal.

15. The method of claim 10 wherein the voltage signal is sampled at least 10 mega-samples per second.

16. The method of claim 10, wherein the transient voltage recorded is induced by lightning.

17. A method of recording a transient voltage comprising:
   amplifying an analog input voltage signal with an input amplifier circuit;
   comparing the input voltage signal to a pre-determined threshold voltage level, and detecting when the amplified analog input voltage signal exceeds the pre-determined threshold voltage level;
   converting the analog amplified input voltage signal to digital data;
   comparing successive samples of the digital data; and
   determining that an output of the input amplifier circuit is clipped if the successive output samples of the digital data are substantially the same.

18. The method of claim 17 further comprising:
   reducing the gain of the input amplifier circuit to capture the input voltage signal.

19. The method of claim 17 further comprises storing the input voltage signal and a corresponding time of arrival.

20. A voltage transient recorder comprising:
   a plurality of input amplifiers each coupled to receive one of a plurality of input voltage signals;
   an amplifier gain adjust circuit coupled to adjust a gain of the plurality of amplifiers;
   an analog-to-digital converter coupled to outputs of the plurality of amplifiers;
   a voltage threshold circuit coupled to the outputs of the plurality of amplifiers;
   a memory device;
   a time circuit; and
   a controller coupled to the analog-to-digital converter, the voltage threshold circuit, the memory device and the amplifier gain adjust circuit, wherein the controller monitors the outputs of the plurality of amplifiers in response to the voltage threshold circuit and determines if the outputs of the plurality of amplifiers are magnitude clipped, the controller further controls the amplifier gain adjust circuit to adjust the gain of the amplifier.

21. A method of recording a lightning induced transient voltage comprising:
   receiving an input voltage signal;
   amplifying the input voltage signal using an input amplifier;
   converting the amplified input voltage signal to a digital input voltage signal;
   comparing the digital input voltage signal to a pre-determined threshold voltage level to detect when the input voltage signal exceeds a pre-determined threshold voltage level indicating that a transient voltage signal is present in the input voltage signal;
   determining if a gain of the input amplifier is too large to accurately capture the full transient voltage signal; and
   reducing the gain of the input amplifier to capture the input voltage signal.

22. The method of claim 21 wherein determining if the input amplifier gain it too large comprises:
   comparing successive samples of the digital input voltage signal; and
   determining that an output of the input amplifier is clipped if the successive output samples of the digital data are substantially the same.

* * * * *